(12) United States Patent
Ma et al.

(10) Patent No.: US 12,527,088 B2
(45) Date of Patent: Jan. 13, 2026

(54) ARRAY SUBSTRATE AND DISPLAY PANEL

(71) Applicant: WUHAN CHINA STAR OPTOELECTRONICS TECHNOLOGY CO., LTD., Wuhan (CN)

(72) Inventors: Tao Ma, Wuhan (CN); Fei Ai, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 466 days.

(21) Appl. No.: 17/973,813

(22) Filed: Oct. 26, 2022

(65) Prior Publication Data
US 2024/0096901 A1  Mar. 21, 2024

(30) Foreign Application Priority Data
Sep. 20, 2022 (CN) .......................... 202211144607.8

(51) Int. Cl.
H01L 27/12 (2006.01)
H10D 86/40 (2025.01)
H10D 86/60 (2025.01)

(52) U.S. Cl.
CPC ........... *H10D 86/60* (2025.01); *H10D 86/411* (2025.01)

(58) Field of Classification Search
CPC .... H10D 86/60; H10D 86/423; H10D 86/421; H10D 30/673; H10D 64/512; H10D 86/411; G02F 1/1362; G02F 1/1343; H10K 50/00–88; H10K 59/00–95
See application file for complete search history.

(56) References Cited

U.S. PATENT DOCUMENTS

| | | | |
|---|---|---|---|
| 2011/0181631 A1* | 7/2011 | Shishido | G09G 3/2077 345/77 |
| 2019/0229131 A1* | 7/2019 | Chung | H10K 59/1213 |
| 2020/0387281 A1* | 12/2020 | Lee | G06F 3/04166 |
| 2021/0057458 A1* | 2/2021 | Kim | G09G 3/3266 |
| 2021/0098509 A1* | 4/2021 | Fu | H10D 86/60 |
| 2023/0074433 A1* | 3/2023 | Cho | H10D 30/6755 |
| 2025/0085577 A1* | 3/2025 | Zhou | G02F 1/13394 |

* cited by examiner

Primary Examiner — Steven B Gauthier
Assistant Examiner — Rhys Poniente Sheker
(74) Attorney, Agent, or Firm — The Roy Gross Law Firm, LLC; Roy D. Gross

(57) ABSTRACT

An array substrate and a display panel are provided. By allowing a gate electrode layer between a first active layer and a second active layer to overlap the first active layer and the second active layer at least partially, respectively, an area occupied by the first active layer, the second active layer, and the gate electrode layer can be reduced, and a design area of sub-pixels can be increased, thereby improving an aperture ratio.

20 Claims, 10 Drawing Sheets

ARRAY SUBSTRATE AND DISPLAY PANEL

CROSS REFERENCE TO RELATED APPLICATIONS

This application claims the benefit of priority of Chinese Patent Application No. 202211144607.8 filed Sep. 20, 2022, the contents of which are all incorporated herein by reference in their entirety.

FIELD OF INVENTION

The present disclosure relates to the field of display technologies, and more particularly, to an array substrate and a display panel.

BACKGROUND OF INVENTION

When an aperture ratio of display panels is smaller, an area available for display will be smaller, which will affect fineness of display qualities. Therefore, how to improve the aperture ratio of the display panels becomes a key to improve the display qualities of the display panels.

SUMMARY OF INVENTION

An embodiment of the present disclosure provides an array substrate and a display panel to improve the aperture ratio.

An embodiment of the present disclosure provides the array substrate, which includes a first active layer, a second active layer, a gate electrode layer, a first electrode, and a second electrode. The second active layer is disposed on the first active layer, the gate electrode layer is disposed between the first active layer and the second active layer, and the first electrode is disposed between the first active layer and the gate electrode layer and is electrically connected to the first active layer; and the second electrode is disposed on one side of the second active layer away from the gate electrode layer and is electrically connected to the second active layer; wherein, the gate electrode layer at least partially overlaps the first active layer, and the gate electrode layer at least partially overlaps the second active layer.

Optionally, in some embodiments of the present disclosure, the first active layer overlaps the second active layer, and the second active layer overlaps the gate electrode layer.

Optionally, in some embodiments of the present disclosure, a mobility of the first active layer is greater than a mobility of the second active layer, and an area of the first electrode is greater than an area of the second electrode.

Optionally, in some embodiments of the present disclosure, a ratio of the mobility of the first active layer to the mobility of the second active layer is equal to a ratio of the area of the first electrode to the area of the second electrode.

Optionally, in some embodiments of the present disclosure, a ratio of the area of the first electrode to the area of the second electrode ranges from 2:1 to 10:1.

Optionally, in some embodiments of the present disclosure, the first electrode and the second electrode do not overlap.

Optionally, in some embodiments of the present disclosure, the array substrate further includes a first conductive layer and a second conductive layer. The first conductive layer is disposed between the first active layer and the first electrode and includes a first source electrode and a first drain electrode, the first source electrode is electrically connected to one end of the first active layer, the first drain electrode is electrically connected to another end of the first active layer, and the first drain electrode is electrically connected to the first electrode. The second conductive layer is disposed between the second active layer and the second electrode and includes a second source electrode and a second drain electrode, the second source electrode is electrically connected to one end of the second active layer, the second drain electrode is electrically connected to another end of the second active layer, and the second drain electrode is electrically connected to the second electrode.

Optionally, in some embodiments of the present disclosure, the second source electrode is further electrically connected to the first source electrode, and the array substrate further includes a first insulating layer, a second insulating layer, and a first interlayer dielectric layer. The first insulating layer is disposed between the first electrode and the gate electrode layer, the second insulating layer is disposed between the gate electrode layer and the second active layer, and the first interlayer dielectric layer is disposed between the second active layer and the second conductive layer. Wherein, the second source electrode is electrically connected to the one end of the second active layer by a first via penetrating through the first interlayer dielectric layer, and the second source electrode is electrically connected to the first source electrode by a second via penetrating through the first interlayer dielectric layer, the second insulating layer, and the first insulating layer; and the second drain electrode is electrically connected to the another end of the second active layer by a third via penetrating through the first interlayer dielectric layer.

Optionally, in some embodiments of the present disclosure, the first drain electrode is in direct contact with the first electrode, and the second drain electrode is in direct contact with the second electrode.

Optionally, in some embodiments of the present disclosure, the array substrate further includes a second interlayer dielectric layer disposed between the first active layer and the first conductive layer, wherein, the first source electrode is electrically connected to the one end of the first active layer by a fourth via penetrating through the second interlayer dielectric layer, and the first drain electrode is electrically connected to the another end of the first active layer by a fifth via penetrating through the second interlayer dielectric layer.

The present disclosure further provides a display panel, which includes the array substrate of one of the embodiments mentioned above and a color filter. The color filter includes a first color filter unit, a second color filter unit, and a black matrix. Wherein, the first color filter unit overlaps the first electrode, the second color filter unit overlaps the second electrode, and the black matrix overlaps the first active layer and the second active layer.

Optionally, in some embodiments of the present disclosure, the display panel further includes a plurality of sub-pixels, wherein, each of the sub-pixels includes the first electrode and the second electrode. Wherein, colors of the first color filter unit and the second color filter unit corresponding to the first electrode and the second electrode of a same sub-pixel are same.

The present disclosure provides the array substrate and the display panel. By allowing the gate electrode layer between the first active layer and the second active layer to overlap the first active layer and the second active layer at least partially, respectively, an area occupied by the first active layer, the second active layer, and the gate electrode layer can be reduced, and a design area of the sub-pixels can be increased, thereby improving the aperture ratio.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION OF PREFERRED EMBODIMENTS

Figure 1A:
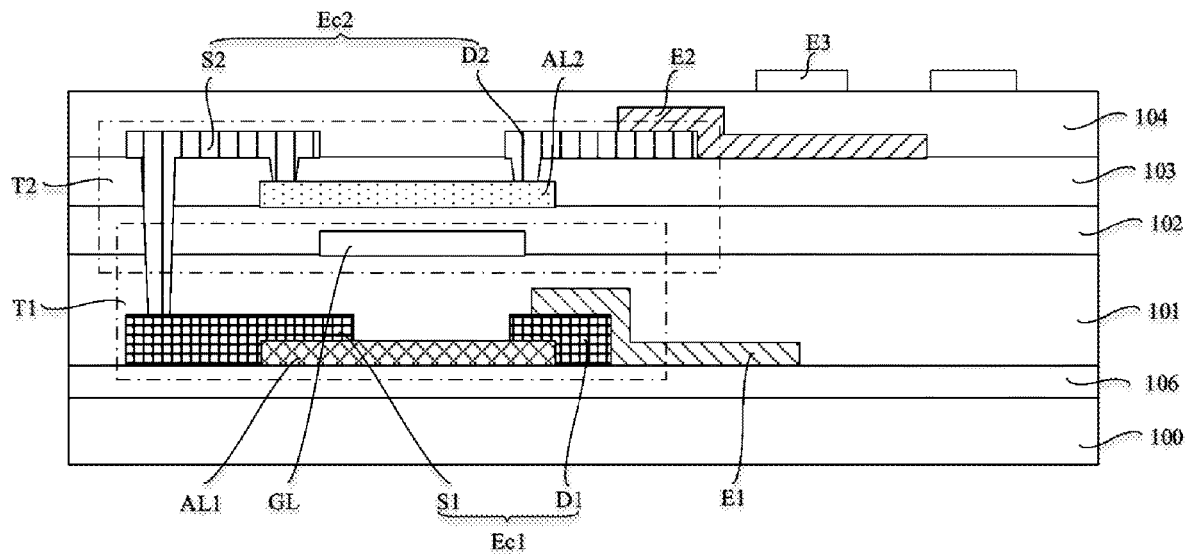
FIGS. 1A to 1D are schematic structural diagrams of an array substrate according to an embodiment of the present disclosure.

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure. In addition, it should be understood that the specific embodiments described herein are only used to illustrate and explain the disclosure and are not used to limit the disclosure. In the present disclosure, in the case of no explanation to the contrary, the orientation words used such as "on" and "under" usually refer to upper and lower directions of the device in actual use or working state, and specifically the directions in the drawings; and "inside" and "outside" refer to the outline of the device.

Specifically, as shown in FIGS. 1A to 1D, which are schematic structural diagrams of an array substrate according to an embodiment of the present disclosure. This embodiment of the present disclosure provides an array substrate. The array substrate includes a first active layer AL1, a second active layer AL2, a gate electrode layer GL, a first electrode E1, and a second electrode E2.

Optionally, a preparation material of the first active layer AL1 includes silicon semiconductor materials, oxide semiconductor materials, etc. Optionally, the silicon semiconductor materials include polysilicon, amorphous silicon, monocrystalline silicon, etc., and the oxide semiconductor materials may include indium gallium zinc oxide (IGZO), indium gallium tin oxide (IGTO), or indium gallium zinc tin oxide (IGZTO). Optionally, the first active layer AL1 may be obtained by a low temperature polysilicon process.

The second active layer AL2 is disposed on the first active layer AL1. Optionally, a preparation material of the second active layer AL2 includes silicon semiconductor materials, oxide semiconductor materials, etc.

Optionally, the preparation material of the first active layer AL1 and the preparation material of the second active layer AL2 may be the same. For example, the preparation material of the first active layer AL1 and the preparation material of the second active layer AL2 are both the silicon semiconductor materials or the oxide semiconductor materials.

Optionally, the preparation material of the first active layer AL1 and the preparation material of the second active layer AL2 may also be different. Optionally, the first active layer AL1 is made by a low temperature polysilicon process, and the second active layer AL2 is made of amorphous silicon or an oxide semiconductor material. Amorphous silicon and oxide semiconductor materials have low mobility (generally about 1 $cm^2/V \cdot s$ to 10 $cm^2/V \cdot s$), which helps achieve device performances at low refresh rates, thereby being beneficial to reduce power consumption. Active layers made by the low temperature polysilicon process have relatively high mobility (generally above 100 $cm^2/V \cdot s$), and are suitable for devices with high refresh rates and high resolutions. Therefore, using different semiconductor materials for the first active layer AL1 and the second active layer AL2 can simultaneously realize the performances of both, thereby being beneficial to realize frequency conversion (that is, the refresh frequency varies between a high refresh frequency and a low refresh frequency) and high-resolution designs.

The gate electrode layer GL is disposed between the first active layer AL1 and the second active layer AL2.

The first electrode E1 is disposed between the first active layer AL1 and the gate electrode layer GL and is electrically connected to the first active layer AL1. The second electrode E2 is disposed on one side of the second active layer AL2 away from the gate electrode layer GL and is electrically connected to the second active layer AL2.

Wherein, the gate electrode layer GL at least partially overlaps the first active layer AL1, and the gate electrode layer GL at least partially overlaps the second active layer AL2, thereby reducing an area occupied by the first active layer AL1, the second active layer AL2, and the gate electrode layer GL. Therefore, it is beneficial to increase a design area of sub-pixels, thereby improving the aperture ratio.

Optionally, the first active layer AL1 overlaps the second active layer AL2, and the second active layer AL2 overlaps the gate electrode layer GL, thereby further reducing the area occupied by the first active layer AL1, the second active layer AL2, and the gate electrode layer GL.

Optionally, a mobility of the first active layer AL1 is greater than a mobility of the second active layer AL2, and an area of the first electrode E1 is greater than an area of the second electrode E2; or the mobility of the first active layer AL1 is less than the mobility of the second active layer AL2, and the area of the first electrode E1 is less than the area of the second electrode E2. Therefore, a problem of display differences can be improved while reducing the power consumption.

Optionally, a ratio of the mobility of the first active layer AL1 to the mobility of the second active layer AL2 is equal to a ratio of the area of the first electrode E1 to the area of the second electrode E2, thereby being beneficial to optimize display quality.

Optionally, the ratio of the area of the first electrode E1 to the area of the second electrode E2 ranges from 2:1 to 10:1.

Figure 1B:
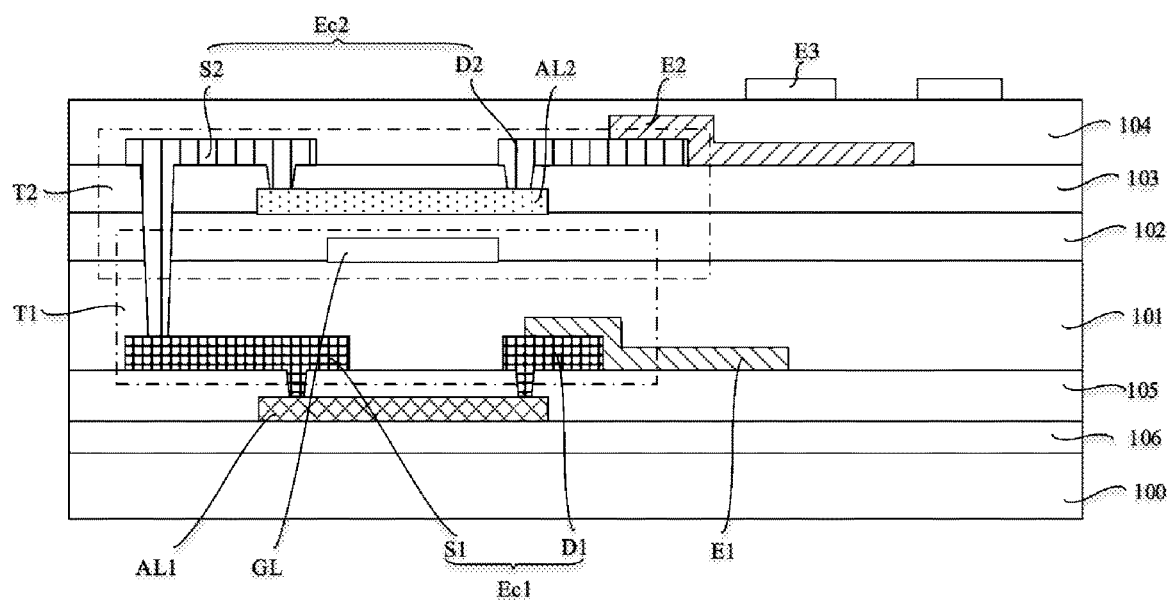

It should be noted that the first electrode E1 and the second electrode E2 of the array substrate shown in FIGS. 1A and 1B are only used to indicate the relative positional relationship between film layers where the first electrode E1 and the second electrode E2 are located. In practical application, the first electrode E1 and the second electrode E2 may have a form shown in FIGS. 1C to 1D, that is, the first electrode E1 and the second electrode E2 do not overlap.

Referring to FIGS. 1A to 1B, the array substrate further includes a first conductive layer Ec1 and a second conductive layer Ec2.

The first conductive layer Ec1 is disposed between the first active layer AL1 and the first electrode E1 and includes a first source electrode S1 and a first drain electrode D1. The first source electrode S1 is electrically connected to one end of the first active layer AL1, the first drain electrode D1 is electrically connected to another end of the first active layer AL1, and the first drain electrode D1 is electrically connected to the first electrode E1.

The second conductive layer Ec2 is disposed between the second active layer AL2 and the second electrode E2 and includes a second source electrode S2 and a second drain electrode D2, the second source electrode S2 is electrically connected to one end of the second active layer AL2, the second drain electrode D2 is electrically connected to another end of the second active layer AL2, and the second drain electrode D2 is electrically connected to the second electrode E2.

Optionally, the first drain electrode D1 is in direct contact with the first electrode E1, and the second drain electrode D2 is in direct contact with the second electrode E2.

Optionally, the first source electrode S1 and the first drain electrode D1 may be arranged on a same layer as the second source electrode S2 and the second drain electrode D2, and the first electrode E1 and the second electrode E2 may also be arranged on a same layer. Therefore, a thickness of the array substrate can be reduced, and at a same time, a loss amount of data signals transmitted to the first electrode E1 and the second electrode E2 can be adjusted, thereby improving the display differences of display parts corresponding to the first electrode E1 and the second electrode E2.

Optionally, the array substrate further includes a third electrode E3, and the third electrode E3 is disposed on the second electrode E2. The third electrode E3 includes a common electrode, and the common electrode is used for transmitting a reference voltage.

Referring to FIGS. 1A and 1B, the array substrate further includes a substrate 100, a first insulating layer 101, a second insulating layer 102, a first interlayer dielectric layer 103, and a passivation layer 104.

Optionally, the substrate 100 includes a rigid substrate and a flexible substrate. The first insulating layer 101 is disposed between the first electrode E1 and the gate electrode layer GL, the second insulating layer 102 is disposed between the gate electrode layer GL and the second active layer AL2, the first interlayer dielectric layer 103 is disposed between the second active layer AL2 and the second conductive layer Ec2, and the passivation layer 104 is disposed between the second electrode E2 and the third electrode E3.

The second source electrode S2 is electrically connected to the second active layer AL2 by a first via penetrating through the first interlayer dielectric layer 103, and the second drain electrode D2 is electrically connected to the another end of the second active layer AL2 by a third via penetrating through the first interlayer dielectric layer 103.

Optionally, the second source electrode S2 is further electrically connected to the first source electrode S1 by a second via penetrating through the first interlayer dielectric layer 103, the second insulating layer 102, and the first insulating layer 101.

Preparation materials, thicknesses, and preparation processes of the substrate 100, the first insulating layer 101, the second insulating layer 102, the first interlayer dielectric layer 103, and the passivation layer 104 can all follow the prior art, and are not repeated herein. Optionally, the array substrate further includes a buffer layer 106 between the first active layer AL1 and the substrate 100.

Optionally, the array substrate further includes a second interlayer dielectric layer 105 disposed between the first active layer AL1 and the first conductive layer Ec1. The first source electrode S1 is electrically connected to the one end of the first active layer AL1 by a fourth via penetrating through the second interlayer dielectric layer 105, and the first drain electrode D1 is electrically connected to the another end of the first active layer AL1 by a fifth via penetrating through the second interlayer dielectric layer 105, as shown in FIG. 1B.

Optionally, the array substrate further includes the buffer layer 106 between the substrate 100 and the first active layer, and other parts (such as polarizers, alignment layers, etc.) not shown.

Figure 2A:
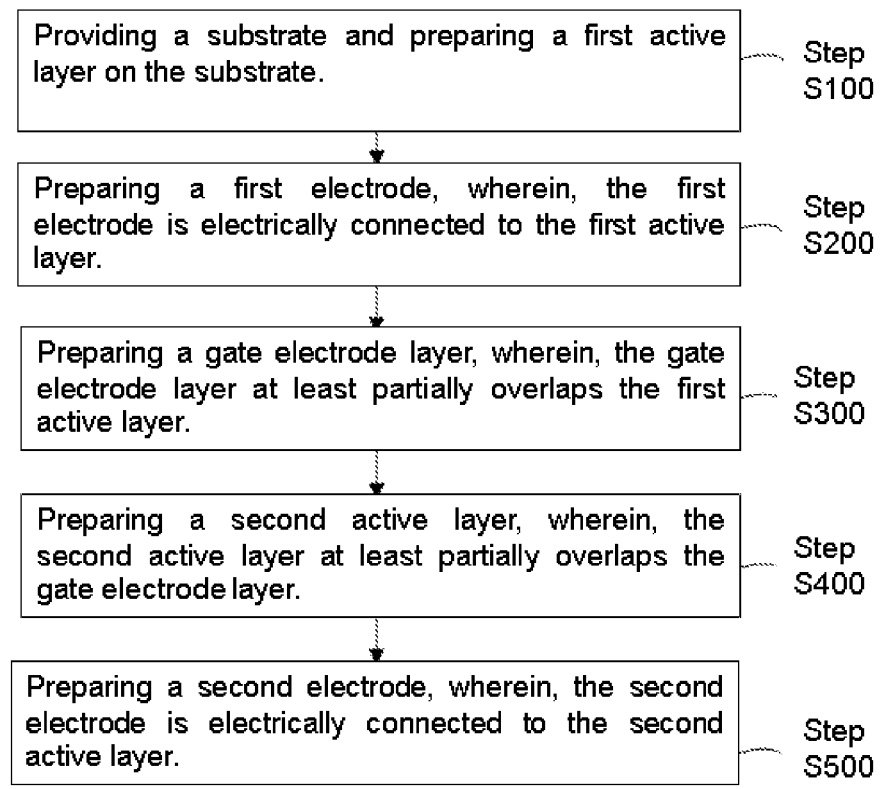
FIG. 2A is a flowchart of a manufacturing process of the array substrate according to an embodiment of the present disclosure.

FIG. 2A is a flowchart of a manufacturing process of the array substrate according to an embodiment of the present disclosure, and FIGS. 2B to 2I are schematic diagrams of the manufacturing process of the array substrate according to an embodiment of the present disclosure. The present disclosure further provides a manufacturing method of the array substrate. The manufacturing method of the array substrate includes following steps.

Figure 2B:
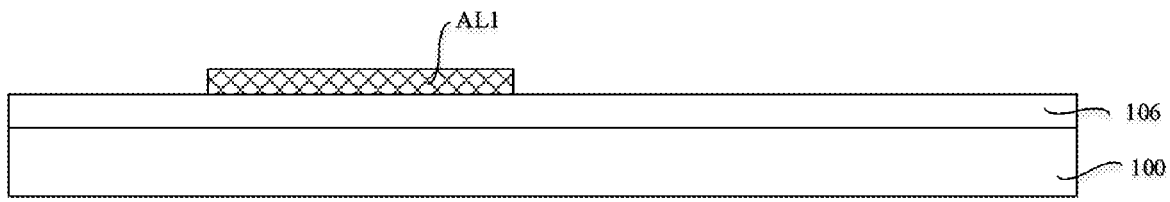
FIGS. 2B to 2I are schematic diagrams of the manufacturing process of the array substrate according to an embodiment of the present disclosure.

Step S100: providing the substrate 100 and preparing the first active layer AL1 on the substrate 100, as shown in FIG. 2B.

Figure 2C:
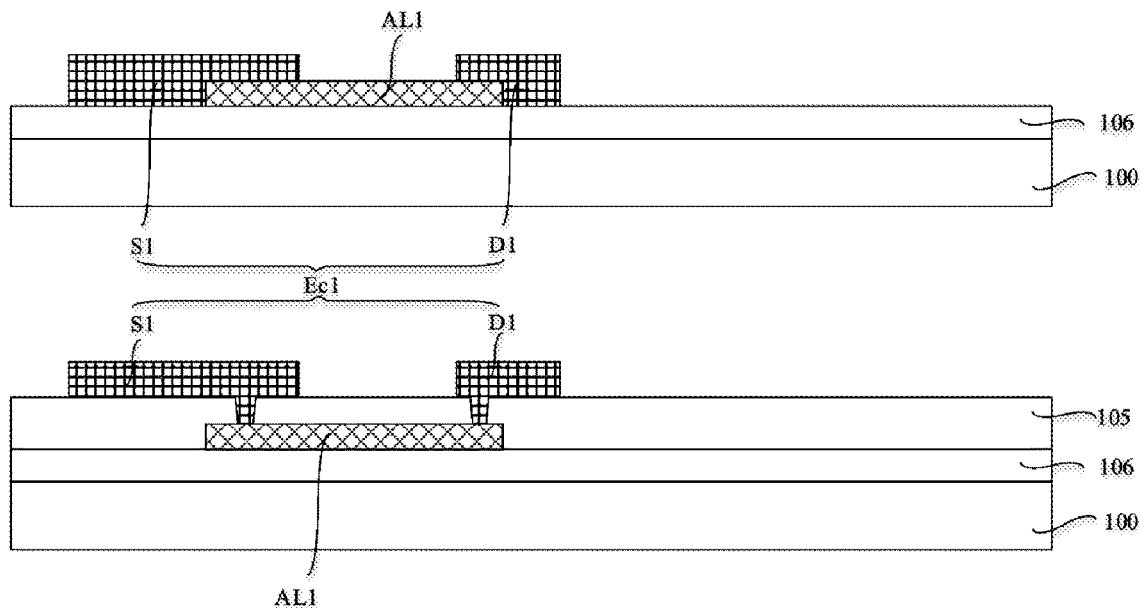
Figure 2D:
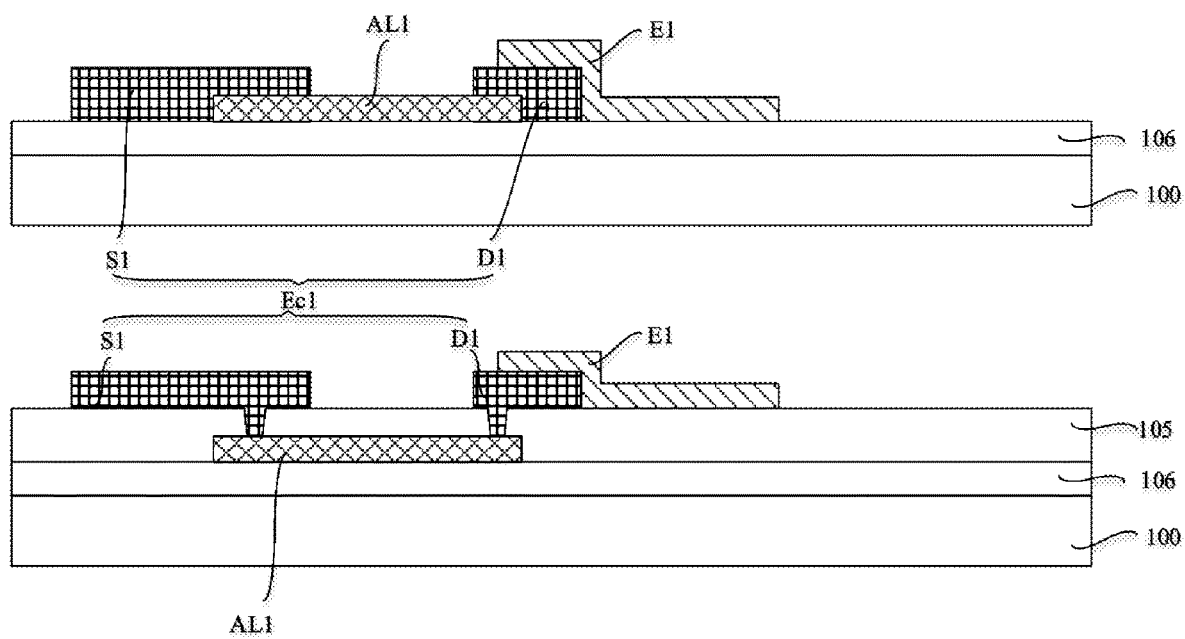

Step S200: preparing the first electrode E1, wherein, the first electrode E1 is electrically connected to the first active layer AL1, as shown in FIG. 2D.

Figure 2E:
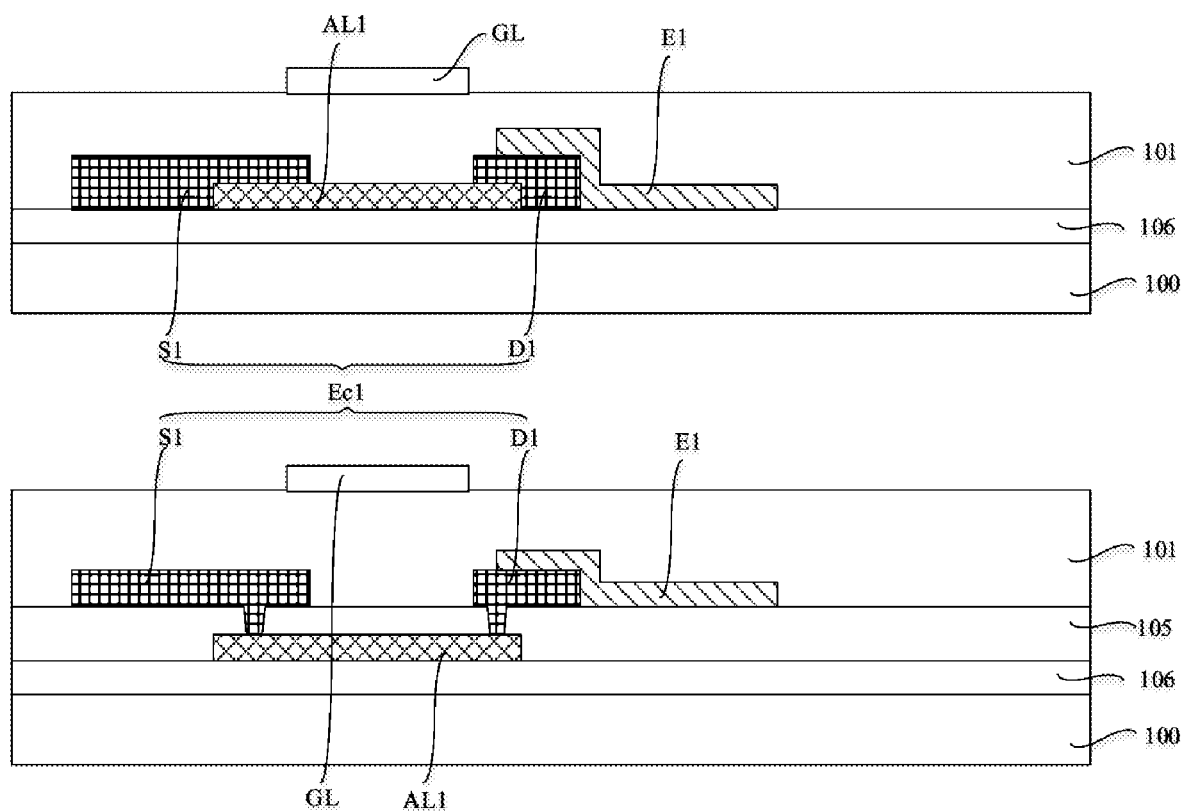

Step S300: preparing the gate electrode layer GL, wherein, the gate electrode layer GL at least partially overlaps the first active layer AL1, as shown in FIG. 2E.

Figure 2F:
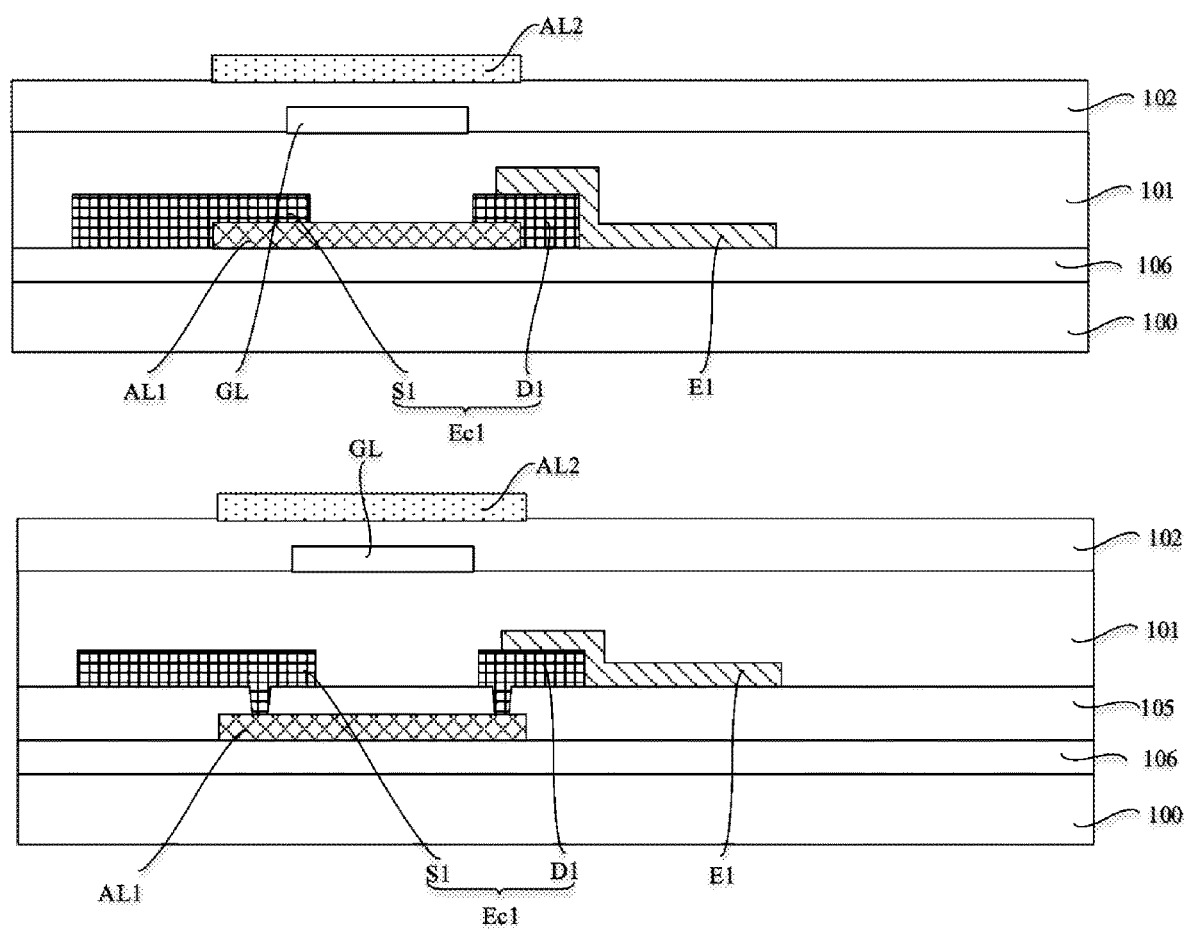

Step S400: preparing the second active layer AL2, wherein, the second active layer AL2 at least partially overlaps the gate electrode layer GL, as shown in FIG. 2F.

Figure 2G:
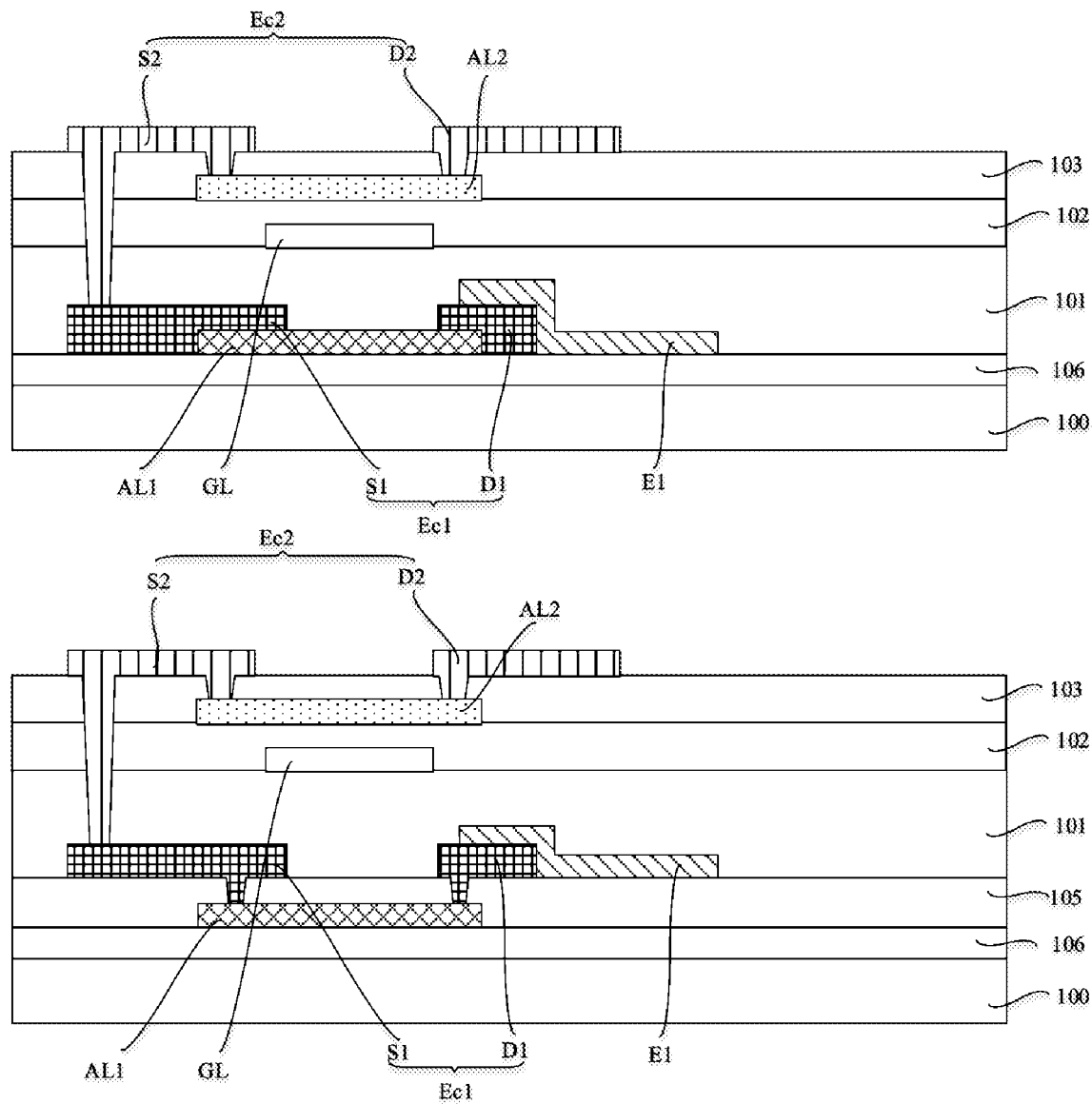
Figure 2H:
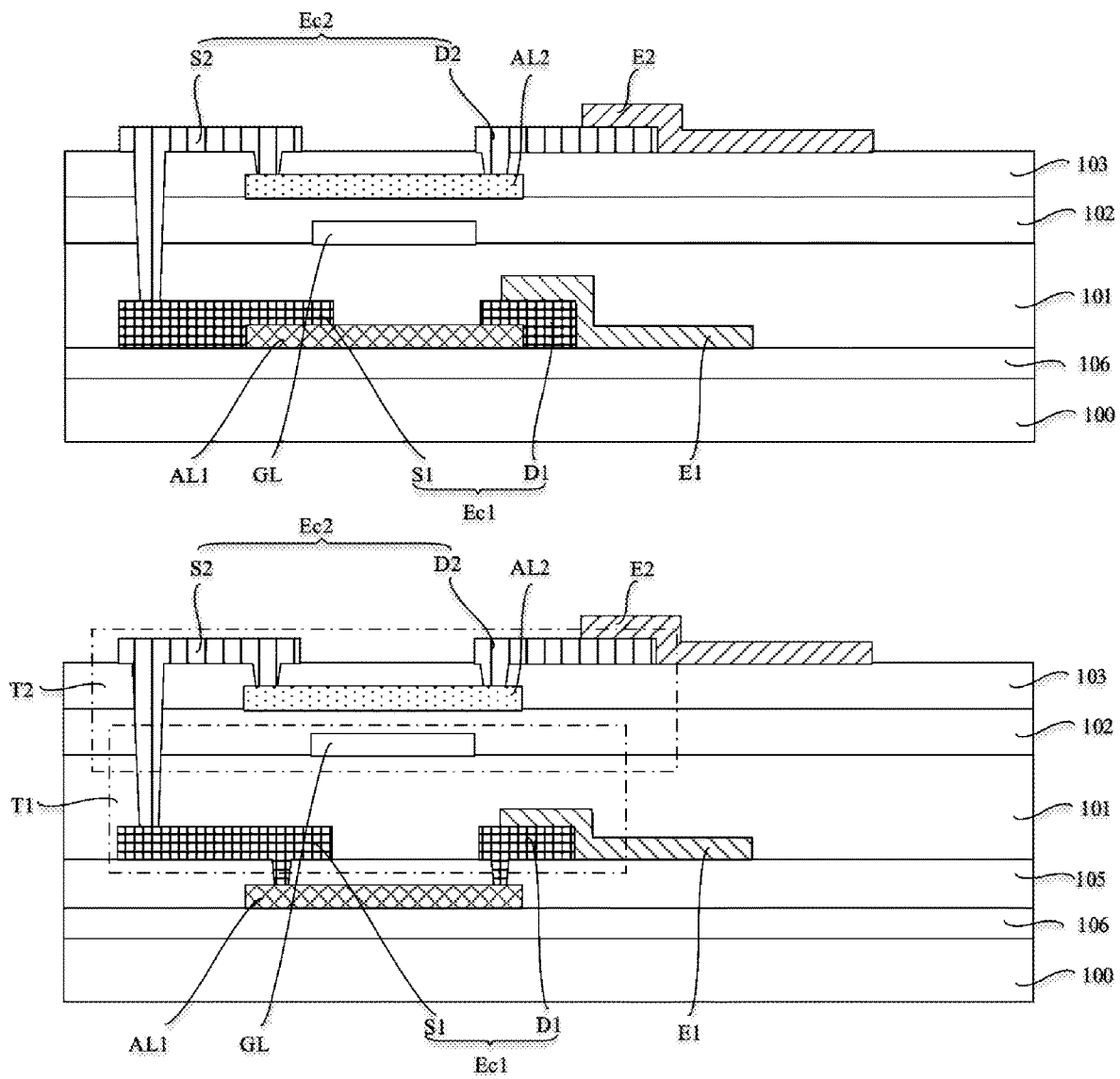

Step S500: preparing the second electrode E2, wherein, the second electrode E2 is electrically connected to the second active layer AL2, as shown in FIG. 2H.

Optionally, before the step S200, the method further includes a step of preparing the first conductive layer Ec1 on the first active layer. Wherein, the first conductive layer Ec1 includes the first source electrode S1 and the first drain electrode D1. The first source electrode S1 is electrically connected to one end of the first active layer AL1, and the first drain electrode D1 is electrically connected to another end of the first active layer AL1, as shown in FIG. 2C. Wherein, the first electrode E1 is electrically connected to the first active layer AL1 through the first drain electrode D1.

Optionally, after the step S200, the method further includes a step of preparing the first insulating layer 101 on the first electrode E1, and the gate electrode layer GL is located on the first insulating layer 101, as shown in FIG. 2E.

Optionally, before preparing the first conductive layer Ed, the method further includes a step of preparing the second interlayer dielectric layer 105 on the first active layer AL1. Wherein, the first conductive layer Ed is located on the second interlayer dielectric layer 105, the first source electrode S1 is electrically connected to the one end of the first active layer AL1 by a fourth via penetrating through the second interlayer dielectric layer 105, and the first drain electrode D1 is electrically connected to the another end of the first active layer AL1 by a fifth via penetrating through the second interlayer dielectric layer 105.

Before the step S400, the method further includes a step of preparing the second insulating layer 102 on the gate electrode layer GL, and the second active layer AL2 is located on the second insulating layer 102, as shown in FIG. 2F.

Optionally, after the step S400, the method further includes a step of preparing the first interlayer dielectric layer 103 and the second conductive layer Ec2 on the second active layer AL2. Wherein, the second conductive layer Ec2 includes the second source electrode S2 and the second drain electrode D2. The second source electrode S2 is electrically connected to the second active layer AL2 by the first via penetrating through the first interlayer dielectric layer 103, and the second drain electrode D2 is electrically connected to the another end of the second active layer AL2 by the third via penetrating through the first interlayer dielectric layer 103, as shown in FIG. 2G. The second electrode E2 is electrically connected to the second active layer AL2 through the second drain electrode D2, as shown in FIG. 2H.

Figure 2I:
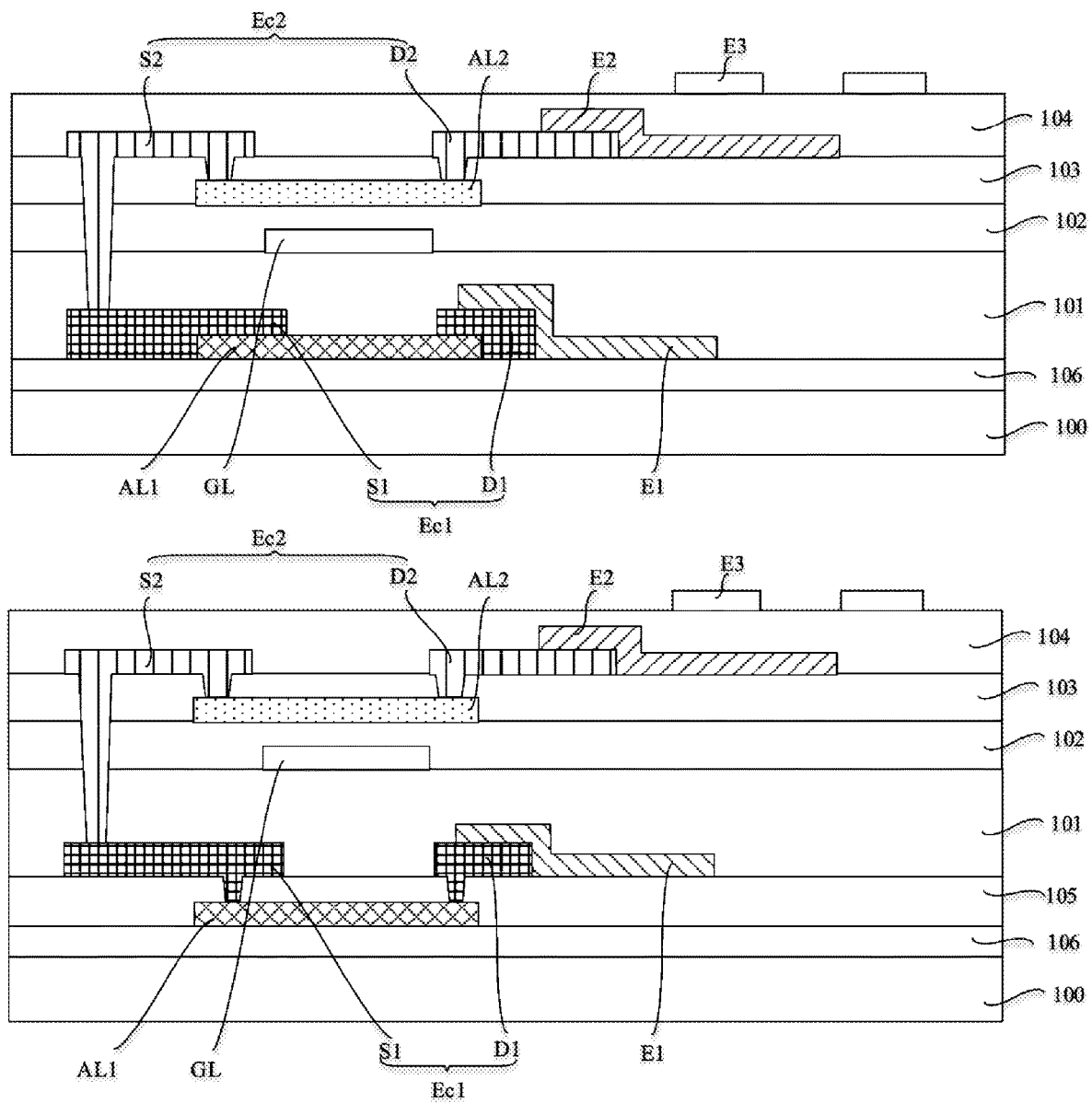

Optionally, after the step S500, the method further includes a step of preparing the passivation layer 104 and the third electrode E3 on the second electrode E2. The third electrode E3 is located on the passivation layer 104, and the third electrode E3 includes the common electrode, as shown in FIG. 2I.

Optionally, before the step S100, the method further includes a step of preparing the buffer layer 106 on the substrate 100.

The present disclosure further provides a display panel, which includes the array substrate of any one of the embodiments mentioned above and the array substrate obtained by the manufacturing method mentioned above.

Figure 3:
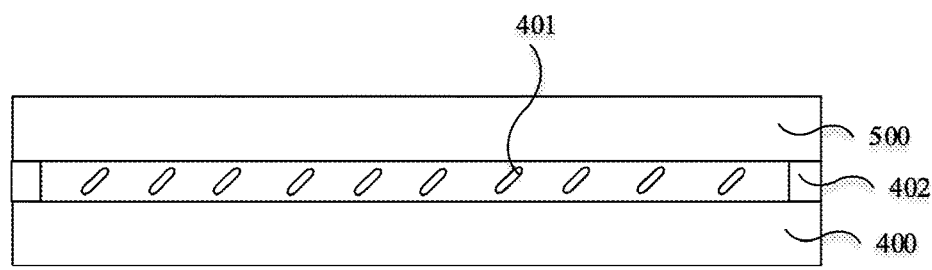
FIG. 3 is a schematic structural diagram of a display panel according to an embodiment of the present disclosure.

FIG. 3 is a schematic structural diagram of the display panel according to an embodiment of the present disclosure. The display panel includes an array substrate 400 of any one of the embodiments mentioned above and a color filter. Optionally, the display panel further includes a color filter substrate 500, liquid crystals 401, a sealant 402, a backlight module, a polarizer, and other parts not shown. The array substrate 400 is disposed opposite to the color filter substrate 500, and the liquid crystals 401 and the sealant 402 are located between the array substrate 400 and the color filter substrate 500.

Optionally, the color filter may be provided in the array substrate. Optionally, when the array substrate is used in the display panel, the color filter may also be arranged in the color filter substrate opposite to the array substrate.

Figure 1C:
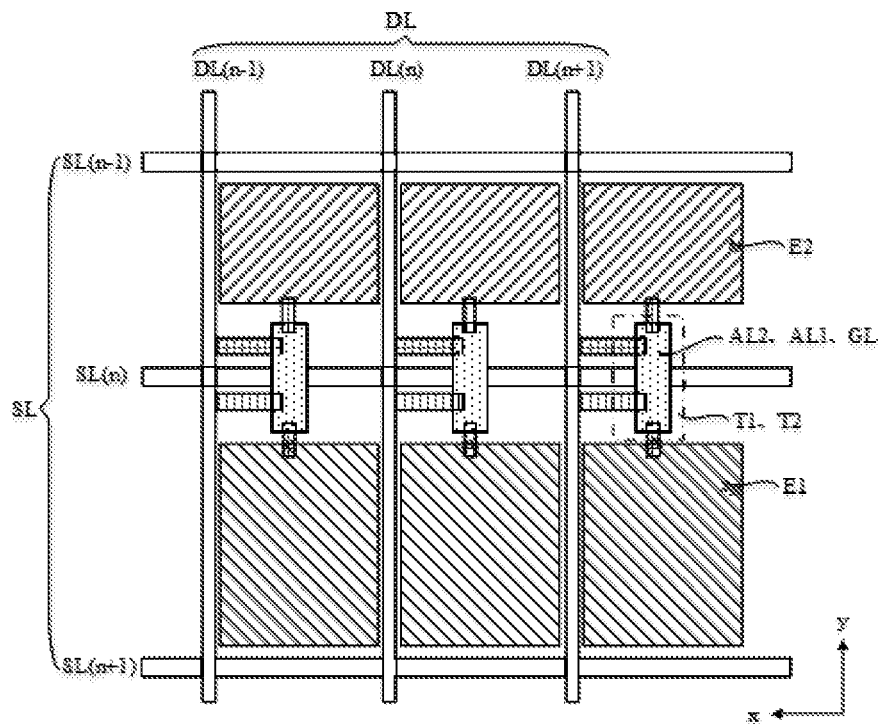
Figure 4A:
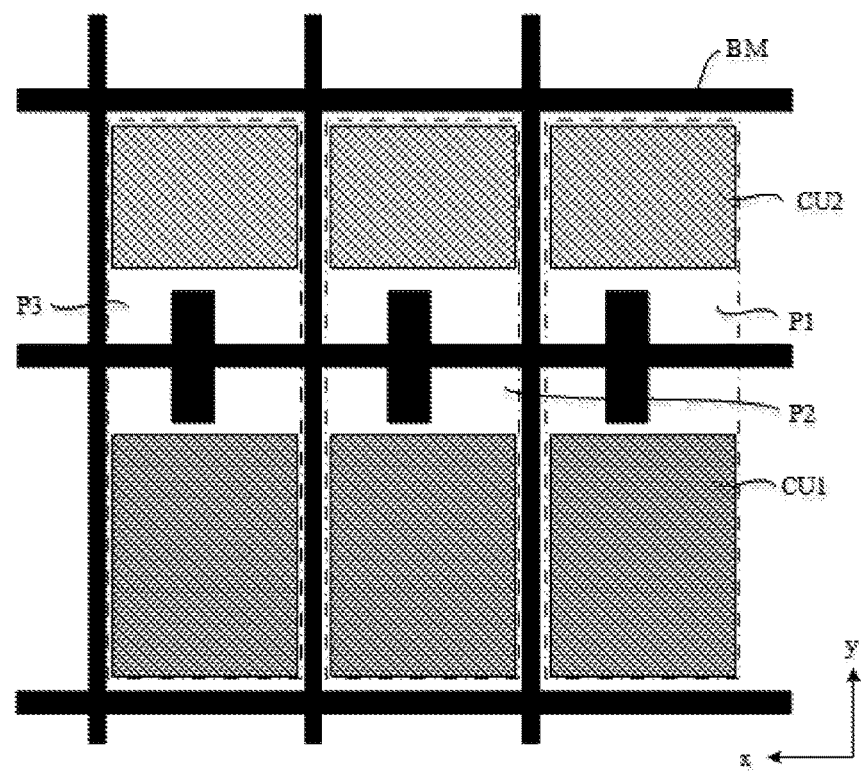
FIGS. 4A to 4B are schematic structural diagrams of a color filter according to an embodiment of the present disclosure.
Figure 4B:
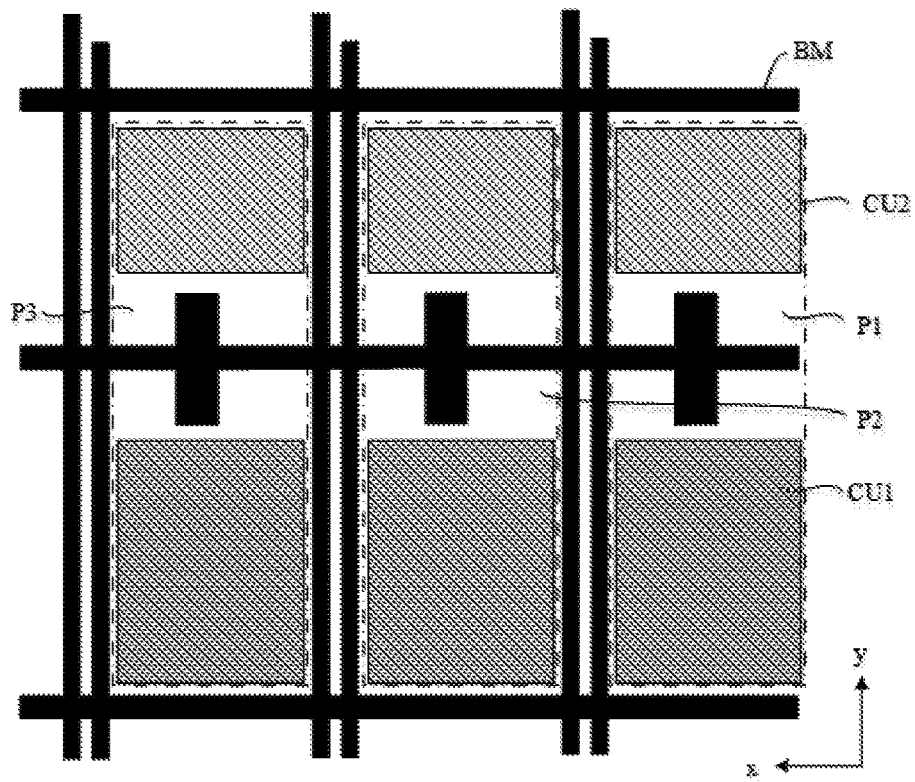

FIGS. 4A to 4B are schematic structural diagrams of the color filter according to an embodiment of the present disclosure. Wherein, FIG. 4A is a color filter corresponding to the array substrate shown in FIG. 1C, and FIG. 4B is a color filter corresponding to the array substrate shown in FIG. 1D. The color filter includes a plurality of color filter units CU and a black matrix BM located between the plurality of color filter units CU. The color filter units CU include a first color filter unit CU1 and a second color filter unit CU2, the first color filter unit CU1 overlaps the first electrode E1, the second color filter unit CU2 overlaps the second electrode E2, and the black matrix BM overlaps the first active layer AL1 and the second active layer AL2.

The display panel including a plurality of sub-pixels is taken as an example for illustrating the application of the array substrate 400. Specifically, referring to FIGS. 1A to 1D and 4A to 4B, the display panel includes a plurality of scan lines SL, a plurality of data lines DL, a plurality of sub-pixels, and a plurality of pixel driving circuits.

Optionally, each of the scan lines SL extends along a first direction x, and the plurality of scan lines SL are arranged along a second direction y. Optionally, the scan lines SL and the data lines DL are arranged crosswise. Optionally, each of the data lines DL extends along the second direction y, and the plurality of data lines DL are arranged along the first direction x. Optionally, the plurality of scan lines SL may be in a same layer as the gate electrode layer GL, and the plurality of data lines DL may be in a same layer as the first conductive layer Ec1 and/or the second conductive layer Ec2.

Optionally, the sub-pixels are arranged in an array. The sub-pixels include a plurality of pixel electrodes, and each of the pixel electrodes includes the first electrode E1 and the second electrode E2.

Optionally, the first electrode E1 and the second electrode E2 of each of the sub-pixels are located on two sides of one of the scan lines SL, so that the first electrode E1 and the second electrode E2 share a same scan signal.

Optionally, at least one of the data lines DL is disposed between two adjacent sub-pixels in the first direction x. One of the scan lines SL may be disposed between two adjacent sub-pixels in the second direction y.

Optionally, when the first electrode E1 and the second electrode E2 of each of the sub-pixels are located on two sides of one of the scan lines SL to allow the first electrode E1 and the second electrode E2 share the same scan signal, there may be no scan lines SL disposed between two adjacent sub-pixels in the second direction y, thereby reducing a number of the scan lines, being beneficial to increase the design area of the sub-pixels, and being beneficial to improve the aperture ratio.

Figure 1D:
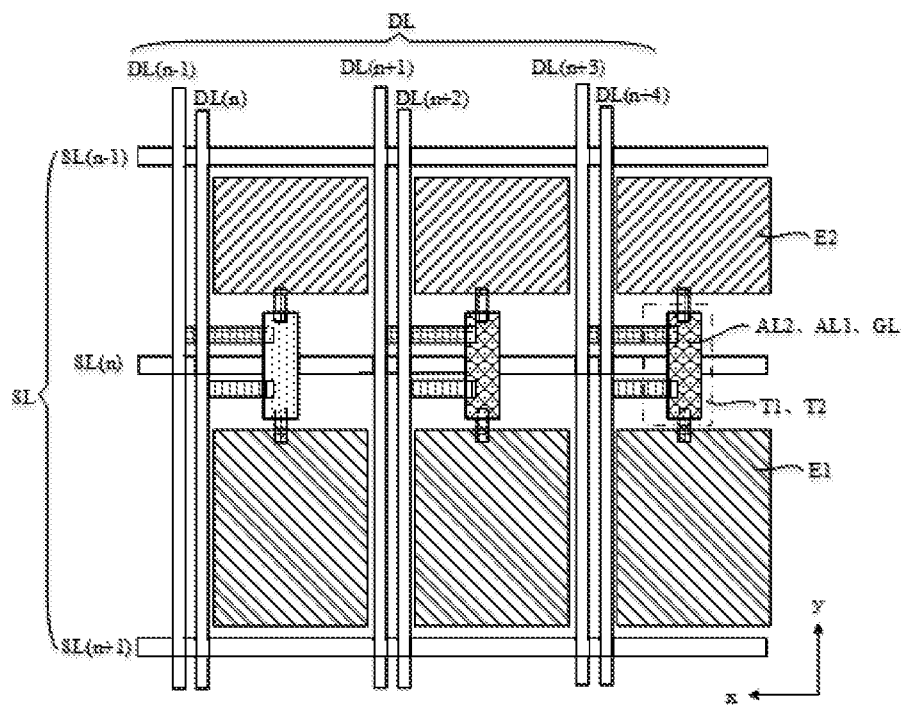

Optionally, the first active layer AL1 and the second active layer AL2 are in the form shown in FIGS. 1C to 1D, and the first active layer AL1 and the second active layer AL2 may be located on both sides of a same scan line SL, respectively. For example, the first active layer AL1 may be located between the first electrode E1 and the scan line SL, and the second active layer AL2 may be located between the second electrode E2 and the scan lines SL.

The pixel driving circuits are electrically connected to the sub-pixels, and each of the pixel driving circuits includes a first transistor T1 and a second transistor T2.

Optionally, the first transistor T1 includes the first active layer AL1, the gate electrode layer GL, the first source electrode S1, and the first drain electrode D1, and the second transistor T2 includes the second active layer AL2, the gate electrode layer GL, the second source electrode S2, and the second drain electrode D2. The first electrode E1 is electrically connected to the first transistor T1, the second electrode E2 is electrically connected to the second transistor T2, and the first transistor T1 and the second transistor T2 share the same gate electrode layer GL. Compared with the first active layer AL1 of the first transistor T1 and the second active layer AL2 of the second transistor T2 being provided with a gate electrode layer, respectively, in the present disclosure, the first transistor T1 and the second transistor T2 share the same gate electrode layer GL, so that the area occupied by the first transistor T1 and the second transistor T2 can be reduced. Therefore, the design area available for the sub-pixels can be correspondingly larger, thereby increasing the design area of the sub-pixels. Since the design area of the sub-pixels is increased, the display area for display can be increased, thereby improving the aperture ratio.

It can be understood that the mobilities of the first transistor T1 and the second transistor T2 may be adjusted by changing the preparation materials and preparation processes of the first active layer AL1 and the second active layer AL2. The gate electrode layer GL included in the first transistor T1 and the second transistor T2 can correspondingly form gate electrodes of the first transistor T1 and the second transistor T2.

When the areas of the first electrode E1 and the second electrode E2 are the same, and the first transistor T1 and the second transistor T2 do not share the same gate electrode layer GL, if the mobilities of the first active layer AL1 and the second active layer AL2 are different, a gate voltage applied to the first transistor T1 and a gate voltage applied to the second transistor T2 will also be different. (That is, one of the gate voltages applied to the first transistor T1 and the second transistor T2 is larger, and another one is smaller.) In general, a gate voltage applied to transistors including active layers having high mobility is low, and a gate voltage applied to transistors including active layers having low mobility is high. This will increase complexity of control circuits, and it is not beneficial to reduce the power consumption. When the areas of the first electrode E1 and the second electrode E2 are the same, the first transistor T1 and the second transistor T2 do not share the same gate electrode layer GL, and the mobilities of the first active layer AL1 and the second active layer AL2 are different, if the gate voltage applied to the first transistor T1 and the gate voltage applied to the second transistor T2 are set to be the same, when the pixel driving circuits drive the sub-pixels to work, parts of the sub-pixels corresponding to the first electrode E1 and the second electrode E2 will have display differences, thereby affecting the display quality.

Therefore, in order to improve the problem of the parts of the sub-pixels corresponding to the first electrode E1 and the second electrode E2 having display differences, which is caused by different mobilities of the first active layer AL1 and the second active layer AL2 and by the same gate voltage applied to the first transistor T1 and the second transistor T2 while reducing the power consumption, the area of the first electrode E1 and the area of the second electrode E2 may be adjusted correspondingly according to the mobility of the first active layer AL1 and the mobility of the second active layer AL2. Optionally, the ratio of the area of the first electrode E1 to the area of the second electrode E2 may be adjusted correspondingly according to the ratio of the mobility of the first active layer AL1 to the mobility of the second active layer AL2.

Optionally, the area of the first electrode E1 is positively correlated with the mobility of the first active layer AL1. The area of the second electrode E2 is positively correlated with the mobility of the second active layer AL2. Therefore, the area of the first electrode E1 and the area of the second electrode E2 may be adjusted correspondingly according to the mobility of the first active layer AL1 and the mobility of the second active layer AL2. Therefore, when the gate voltage applied to the first transistor T1 and the gate voltage applied to the second transistor T2 are adjusted to reduce the power consumption, the problem of the parts of the sub-pixels corresponding to the first electrode E1 and the second electrode E2 having display differences caused by different mobilities of the first active layer AL1 and the second active layer AL2 and by the same gate voltage applied to the first transistor T1 and the second transistor T2 can be improved.

Optionally, the mobility of the first active layer AL1 is greater than the mobility of the second active layer AL2, and the area of the first electrode E1 is greater than the area of the second electrode E2; or the mobility of the first active layer AL1 is less than the mobility of the second active layer AL2, and the area of the first electrode E1 is less than the area of the second electrode E2.

The area of the first electrode E1 and the area of the second electrode E2 are adjusted correspondingly according to the mobility of the first active layer AL1 and the mobility of the second active layer AL2, so that the gate voltage applied to the transistor which is electrically connected to one of the first electrode E1 or the second electrode E2 having a smaller area can be reduced. (That is, for example, in the first electrode E1 and the second electrode E2, the area of the first electrode E1 is smaller than the area of the second electrode E2.) Correspondingly, if the mobility of the first active layer AL1 is smaller than the mobility of the second active layer AL2, the gate voltage applied to the first transistor T1 can be reduced, or the gate voltage applied to the first transistor T1 can even be reduced to a level of the gate voltage applied to the second transistor T2 to reduce the power consumption.

One of the gate voltages applied to the first transistor T1 or the second transistor T2 is reduced because one of the first electrode E1 or the second electrode E2 has a smaller area. One of the first electrode E1 or the second electrode E2 having a smaller area means that the one of the first electrode E1 or the second electrode E2 having the smaller area has a smaller proportion in the sub-pixels. Therefore, an area ratio of the display differences exhibited by the sub-pixels will be reduced. That is, in the first electrode E1 and the second electrode E2, if the area of the first electrode E1 is smaller than that of the second electrode E2, a proportion of the sub-pixels corresponding to the first electrode E1 will be less than a proportion of the sub-pixels corresponding to the second electrode E2. Therefore, when the sub-pixels corresponding to the first electrode E1 and the second electrode E2 have display differences, the display performance in the sub-pixels is dominated by the part of the sub-pixels corresponding to the second electrode E2. Therefore, for the area of the sub-pixels corresponding to the first electrode E1 and the area of the sub-pixels corresponding to the second electrode E2, compared with an area design of 1:1, the area design of the present disclosure is 1:x, wherein, x is greater than 1. Therefore, the area ratio of the display differences exhibited by the sub-pixels can be reduced, thereby improving the display quality while reducing the power consumption.

Optionally, the ratio of the mobility of the first active layer AL1 to the mobility of the second active layer AL2 is equal to the ratio of the area of the first electrode E1 to the area of the second electrode E2, so that the ratio of the area of the first electrode E1 to the area of the second electrode E2 can be correspondingly adjusted according to charging abilities of the first transistor T1 and the second transistor T2. Therefore, both the part of the sub-pixels corresponding to the first electrode E1 and the part of the sub-pixels corresponding to the second electrode E2 can have better display performances, thereby optimizing the display quality.

Optionally, the mobility of the first active layer AL1 is greater than the mobility of the second active layer AL2, and the ratio of the area of the first electrode E1 to the area of the second electrode E2 ranges from 2:1 to 10:1. Optionally, the ratio of the area of the first electrode E1 to the area of the second electrode E2 may be 2:1, 5:2, 3:1, 7:2, 4:1, 9:2, 5:1, 11:2, 6:1, 13:2, 7:1, 15:2, 8:1, 17:2, 9:1, 19:2, or 10:1.

Optionally, based on the existing preparation process conditions, the ratio of the mobility of the first active layer AL1 to the mobility of the second active layer AL2 is 2:1, and the ratio of the area of the first electrode E1 to the area of the second electrode E2 is 2:1.

It can be understood that the mobility of the first active layer AL1 may also be less than the mobility of the second active layer AL2, and correspondingly, the ratio of the area of the first electrode E1 to the area of the second electrode E2 ranges from 1:2 to 1:10.

The gate voltage applied to the first transistor T1 and the gate voltage applied to the second transistor T2 are applied to the gate electrodes of the first transistor T1 and the second transistor T2 by the scan lines SL. Optionally, the gate voltage applied to the first transistor T1 is equal to the gate voltage applied to the second transistor T2, so that the complexity of the control circuits can be reduced while reducing the power consumption.

In addition, the first source electrode S1 and the first drain electrode D1 may be arranged in different layers from the second source electrode S2 and the second drain electrode D2, so that the first transistor T1 and the second transistor T2 can have a larger overlapping area, thereby reducing the area occupied by the first transistor T1 and the second transistor T2. The first electrode E1 may be disposed in a different layer from the second electrode E2, so that the data signals transmitted to the first electrode E1 and the second electrode E2 through the first transistor T1 and the second transistor T2 can have a similar amount of loss, thereby improving the display differences between the parts of the sub-pixels corresponding to the first electrode E1 and the second electrode E2.

Referring to FIGS. 1A to 1C, the first electrode E1 and the second electrode E2 in a same pixel electrode are electrically connected to a same data line DL by the first transistor T1 and the second transistor T2, correspondingly. Therefore, a same data signal can be transmitted to the first electrode E1 and the second electrode E2 through the same data line DL.

Optionally, the second source electrode S2 and the first source electrode S1 are electrically connected to a same data line DL. Optionally, when the second source electrode S2 and the first source electrode S1 are electrically connected to the same data line DL, the second source electrode S2 is electrically connected to the first source electrode S1 by the second via penetrating through the first interlayer dielectric layer 103, the second insulating layer 102, and the first insulating layer 101. Optionally, when the second source electrode S2 and the first source electrode S1 are electrically connected to the same data line DL, the second source electrode S2 may also be electrically connected to the first source electrode S1 by an intermediate electrode in the same layer as the gate electrode layer GL.

Optionally, the first electrode E1 and the second electrode E2 can receive different data signals, correspondingly. As shown in FIG. 1D, the first electrode E1 and the second electrode E2 in a same pixel electrode are electrically connected to different data lines DL by the first transistor T1 and the second transistor T2, correspondingly. Therefore, according to luminous efficiency of each of the sub-pixels, switching frequencies of the first transistor T1 and the second transistor T2 and voltage ratios of the first electrode E1 and the second electrode E2 can be effectively controlled, thereby greatly improving uniformity of display transmittances. Meanwhile, since the data signals received by the first electrode E1 and the second electrode E2 are different, when one of the first electrode E1 or the second electrode E2 needs to receive an effective data signal, a data line DL electrically connected to another one of the first electrode E1 or the second electrode E2 may not transmit the data signal, thereby reducing the power consumption.

Optionally, the data lines DL include first data lines (for example, the first data lines include DL(n), DL(n+2), and DL(n+4) in FIG. 1D) and second data lines (for example, the second data lines include DL(n−1), DL(n+1), and DL(n+3) in FIG. 1D). The first source electrode S1 of the first transistor T1 is electrically connected to the first data lines, and the second source electrode S2 is electrically connected to the second data lines.

Optionally, display colors of the sub-pixels corresponding to the first electrode E1 and the second electrode E2 may be the same or may be different. Optionally, the display colors of the sub-pixels corresponding to the first electrode E1 include red, green, blue, yellow, and white, and the display colors of the sub-pixels corresponding to the second electrode E2 include red, green, blue, yellow, and white. It can be understood that in order to realize color display of the sub-pixels corresponding to the first electrode E1 and the second electrode E2, the color filter needs to be set.

Optionally, colors of the first color filter unit CU1 and the second color filter unit CU2 corresponding to the first electrode E1 and the second electrode E2 of a same sub-pixel may be the same, so that the display colors of the sub-pixels corresponding to the first electrode E1 and the second electrode E2 can be the same. Or the colors of the first color filter unit CU1 and the second color filter unit CU2 corresponding to the first electrode E1 and the second electrode E2 of the same sub-pixel may be different, so that the display colors of the sub-pixels corresponding to the first electrode E1 and the second electrode E2 can be different. Colors of first color filter units CU1 corresponding to first electrodes E1 of different sub-pixels may be same or different, and colors of second color filter units CU2 corresponding to second electrodes E2 of different sub-pixels may be same or different. As shown in FIGS. 4A to 4B, a color of a first color filter unit CU1 corresponding to a first electrode E1 of a sub-pixel P1 is red, and a color of a second color filter unit CU2 corresponding to a second electrode E2 of the sub-pixel P1 is red. A color of a first color filter unit CU1 corresponding to a first electrode E1 of a sub-pixel P2 is green, and a color of a second color filter unit CU2 corresponding to a second electrode E2 of the sub-pixel P2 is green. A color of a first color filter unit CU1 corresponding to a first electrode E1 of a sub-pixel P3 is blue, and a color of a second color filter unit CU2 corresponding to a second electrode E2 of the sub-pixel P3 is blue.

Optionally, when a design of the array substrate shown in FIG. 1D is used, the switching frequencies and voltage distribution ratios of transistors of the sub-pixels corresponding to the first electrode E1 and the second electrode E2 can be controlled according to light transmittances of the color filter units CU. (For example, light-emitting colors of the sub-pixels are red, green, and blue, a light transmittance of the color filter units CU corresponding to the sub-pixels emitting red light is less than a light transmittance of the color filter units CU corresponding to the sub-pixels emitting green light and is greater than a light transmittance of the color filter units CU corresponding to the sub-pixels emitting blue light.) Therefore, the uniformity of display transmittances can be greatly improved, and different voltage signals can also be independently provided to the parts of the sub-pixels corresponding to the first electrode E1 and the second electrode E2.

Optionally, the first electrode E1 and the second electrode E2 may also belong to different sub-pixels. Optionally, the black matrix BM may also overlap the gate electrode layer GL and the data lines DL.

The present disclosure further provides a display device, which includes the display panel. The display device includes a movable display device (such as a notebook computer, a mobile phone, etc.), a fixed terminal (such as a desktop computer, a TV, etc.), a measuring device (such as a sports bracelet, a thermometer, etc.), etc.

Specific examples are used herein to explain the principles and implementation of the present disclosure. The descriptions of the above embodiments are only used to help understand the methods and main ideas thereof of the present disclosure. Meanwhile, for those skilled in the art, the range of specific implementation and application may be changed according to the ideas of the present disclosure. In summary, the content of the specification should not be construed as causing limitations to the present disclosure.

What is claimed is:

1. An array substrate, comprising:
   a first active layer;
   a second active layer disposed on the first active layer;
   a gate electrode layer disposed between the first active layer and the second active layer;
   a first electrode disposed between the first active layer and the gate electrode layer and electrically connected to the first active layer; and
   a second electrode disposed on one side of the second active layer away from the gate electrode layer and electrically connected to the second active layer;
   wherein the gate electrode layer at least partially overlaps the first active layer, and the gate electrode layer at least partially overlaps the second active layer; and
   wherein a ratio of a mobility of the first active layer to a mobility of the second active layer is equal to a ratio of an area of the first electrode to an area of the second electrode.

2. The array substrate according to claim 1, wherein the first active layer overlaps the second active layer, and the second active layer overlaps the gate electrode layer.

3. The array substrate according to claim 2, wherein the mobility of the first active layer is greater than the mobility of the second active layer, and the area of the first electrode is greater than the area of the second electrode.

4. The array substrate according to claim 3, wherein a ratio of the area of the first electrode to the area of the second electrode ranges from 2:1 to 10:1.

5. The array substrate according to claim 1, wherein the first electrode and the second electrode do not overlap.

6. The array substrate according to claim 5, further comprising:
   a first conductive layer disposed between the first active layer and the first electrode, wherein the first conductive layer comprises a first source electrode and a first drain electrode, the first source electrode is electrically connected to one end of the first active layer, the first drain electrode is electrically connected to another end of the first active layer, and the first drain electrode is electrically connected to the first electrode; and
   a second conductive layer disposed between the second active layer and the second electrode, wherein the second conductive layer comprises a second source electrode and a second drain electrode, the second source electrode is electrically connected to one end of the second active layer, the second drain electrode is electrically connected to another end of the second active layer, and the second drain electrode is electrically connected to the second electrode.

7. The array substrate according to claim 6, wherein the second source electrode is further electrically connected to the first source electrode, and the array substrate further comprises:
   a first insulating layer disposed between the first electrode and the gate electrode layer;
   a second insulating layer disposed between the gate electrode layer and the second active layer; and
   a first interlayer dielectric layer disposed between the second active layer and the second conductive layer;
   wherein the second source electrode is electrically connected to the one end of the second active layer by a first via penetrating through the first interlayer dielectric layer, and the second source electrode is electrically connected to the first source electrode by a second via penetrating through the first interlayer dielectric layer, the second insulating layer, and the first insulating layer; and the second drain electrode is electrically connected to the another end of the second active layer by a third via penetrating through the first interlayer dielectric layer.

8. The array substrate according to claim 6, wherein the first drain electrode is in direct contact with the first electrode, and the second drain electrode is in direct contact with the second electrode.

9. The array substrate according to claim 7, further comprising:
   a second interlayer dielectric layer disposed between the first active layer and the first conductive layer, wherein the first source electrode is electrically connected to the one end of the first active layer by a fourth via penetrating through the second interlayer dielectric layer, and the first drain electrode is electrically connected to the another end of the first active layer by a fifth via penetrating through the second interlayer dielectric layer.

10. A display panel, comprising an array substrate and a color filter;
    the array substrate comprising a first active layer; a second active layer disposed on the first active layer; a gate electrode layer disposed between the first active layer and the second active layer; a first electrode disposed between the first active layer and the gate electrode layer and electrically connected to the first active layer; and a second electrode disposed on one side of the second active layer away from the gate electrode layer and electrically connected to the second active layer; and
    the color filter comprising a first color filter unit, a second color filter unit, and a black matrix;
    wherein the gate electrode layer at least partially overlaps the first active layer, and the gate electrode layer at least partially overlaps the second active layer;
    wherein a ratio of a mobility of the first active layer to a mobility of the second active layer is equal to a ratio of an area of the first electrode to an area of the second electrode; and
    wherein the first color filter unit overlaps the first electrode, the second color filter unit overlaps the second electrode, and the black matrix overlaps the first active layer and the second active layer.

11. The display panel according to claim 10, further comprising:
    a plurality of sub-pixels, wherein each of the sub-pixels comprises the first electrode and the second electrode;

wherein colors of the first color filter unit and the second color filter unit corresponding to the first electrode and the second electrode of a same sub-pixel are the same.

12. The display panel according to claim 10, further comprising a plurality of scan lines, a plurality of data lines, a plurality of sub-pixels, and a plurality of pixel driving circuits.

13. The display panel according to claim 12, wherein each of the scan lines extends along a first direction, and the plurality of scan lines are arranged along a second direction.

14. The display panel according to claim 12, wherein the scan lines and the data lines are arranged crosswise.

15. The display panel according to claim 12, wherein the plurality of scan lines are arranged in a same layer as the gate electrode layer.

16. The display panel according to claim 12, wherein the sub-pixels comprise a plurality of pixel electrodes, each of the pixel electrodes comprises the first electrode and the second electrode, and each of the pixel driving circuits comprises a first transistor and a second transistor.

17. The display panel according to claim 16, wherein the first electrode and the second electrode of each of the sub-pixels are located on two sides of one of the scan lines, so that the first electrode and the second electrode share a same scan signal.

18. The display panel according to claim 16, wherein the first transistor comprises the first active layer, and the second transistor comprises the second active layer.

19. The display panel according to claim 18, wherein the first electrode and the second electrode in a same pixel electrode are electrically connected to a same data line through the first transistor and the second transistor, respectively.

20. The display panel according to claim 18, wherein the first electrode and the second electrode in a same pixel electrode are electrically connected to different data lines through the first transistor and the second transistor, respectively.

\* \* \* \* \*